United States Patent [19]

Beratan et al.

[11] Patent Number: 5,603,848

[45] Date of Patent: Feb. 18, 1997

[54] METHOD FOR ETCHING THROUGH A SUBSTRATE TO AN ATTACHED COATING

[75] Inventors: Howard R. Beratan, Richardson; James F. Belcher, Plano; Scott R. Summerfelt, Dallas, all of Tex.

[73] Assignee: Texas Instruments Incorporated, Dallas, Tex.

[21] Appl. No.: 367,641

[22] Filed: Jan. 3, 1995

[51] Int. Cl.$^6$ .............. B44C 1/22; C03C 19/00; C03C 25/06; C23F 1/00
[52] U.S. Cl. .............. 216/17; 216/94; 216/96; 216/101; 156/635.1; 156/643.1
[58] Field of Search .............. 216/17, 94, 96, 216/101; 156/635.1, 643.1

[56] References Cited

U.S. PATENT DOCUMENTS

| | | | |
|---|---|---|---|
| 3,846,820 | 11/1974 | Lampe, et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,275,302 | 6/1981 | Imbert et al. | 250/330 |
| 4,379,232 | 4/1983 | Hopper | 250/332 |
| 4,594,507 | 6/1986 | Elliott et al. | 250/331 |
| 4,663,529 | 5/1987 | Jenner et al. | 250/338 |
| 4,678,836 | 7/1987 | Marayama et al. | 156/635 |
| 4,705,361 | 11/1987 | Frazier et al. | 350/355 |

(List continued on next page.)

FOREIGN PATENT DOCUMENTS

| | | |
|---|---|---|
| 2111746 | 9/1971 | Germany . |
| 2752704 | of 1978 | Germany . |
| 2251952 | 7/1992 | United Kingdom . |
| WO9116607 | 10/1991 | WIPO . |

OTHER PUBLICATIONS

F. Rousseau, et al., *New Approaches for Dry Etching Metal Oxides at Low Temperature and High Rates*, Materials Research Society Symposia Proceedings, vol. 268, pp. 57–63, 1992.

F. Rousseau, et al., *Low–temperature Dry Etching of Metal Oxides and ZnS via Formation of Volatile Metal β–Diketonate Complexes*, Journal of Materials Chemistry, vol. 2 No. 8, pp. 893–894, 1992.

PlasmaQuest, *Electron Cyclotron Resonance: At the Cusp of a Technology Shift*, paper prepared by PlasmaQuest, Inc. 850 N. Dorothy, Suite 504, Richardson, Texas 75081, vol. 6, No. 1.

R. A. Wood, "HIDAD–A Monolithic, Silicon, Uncooled Infrared Imaging Focal Plane Array," *HIDAD*, date unknown, pp. 579–581.

H. R. Kaufman, et al., "Characteristics, Capabilities and Applications of Broad–Beam Sources," Commonwealth Scientific Corporation (38 pages).

(List continued on next page.)

*Primary Examiner*—Glenn A. Caldarola
*Assistant Examiner*—J. Pasterczyk
*Attorney, Agent, or Firm*—Brian A. Carlson; James C. Kesterson; Richard L. Donaldson

[57] ABSTRACT

An etching process is provided using electromagnetic radiation and a selected etchant (52) to selectively remove various types of materials (53) from a substrate (48). Contacts (49, 56, 64) may be formed to shield the masked regions (51) of the substrate (48) having an attached coating (20) during irradiation of the unmasked regions (53) of the substrate (48). The unmasked regions (53) are then exposed to an etchant (52) and irradiated to substantially increase their reactivity with the etchant (52) such that the etchant (52) etches the unmasked regions (53) substantially faster than the masked regions (51) and the contacts (49, 56, 64).

30 Claims, 3 Drawing Sheets

U.S. PATENT DOCUMENTS

| | | | |
|---|---|---|---|
| 4,705,593 | 11/1987 | Haigh et al. | 156/635 |
| 4,750,979 | 6/1988 | Gee et al. | 204/192.3 |
| 4,751,387 | 6/1988 | Robillard | 250/331 |
| 4,871,416 | 10/1989 | Fukuda | 156/635 |
| 4,949,783 | 8/1990 | Lakios et al. | 165/80.1 |
| 4,980,338 | 12/1990 | Yamazaki | 505/505 |
| 4,994,672 | 2/1991 | Cross et al. | 250/330 |
| 5,010,251 | 4/1991 | Grinberg et al. | 250/332 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,183,531 | 2/1993 | Terakado | 156/643 |
| 5,196,703 | 3/1993 | Keenan | 250/332 |
| 5,201,989 | 4/1993 | Douglas et al. | 156/635 |
| 5,238,529 | 8/1993 | Douglas | 156/635 |
| 5,238,530 | 8/1993 | Douglas et al. | 156/635 |
| 5,242,537 | 9/1993 | Nelson | 156/643 |
| 5,264,326 | 11/1993 | Miessner et al. | 430/313 |
| 5,279,702 | 1/1994 | Douglas | 156/635 |
| 5,312,516 | 5/1994 | Douglas et al. | 156/635 |
| 5,367,167 | 11/1994 | Keenan | 250/338.4 |
| 5,374,330 | 12/1994 | Douglas | 156/635 |
| 5,460,687 | 10/1995 | Douglas | 216/48 |

OTHER PUBLICATIONS

R. N. Castellano, et al., "A Survey of Ion Beam Milling Techniques for Piezoelectric Device Fabrication," pp. 128–134.

Yamamichi, et al., "SrTiO$_3$ Thin Film Preparation by Ion Beam Sputtering and Its Dielectric Properties," Fundamental Research Laboratories, NEC Corporation, 1991, pp. 2193–2196.

R. Watton, et al., "Technologies and Performance for Linear and Two Dimensional Pyroelectric Arrays," *SPIE vol. 510 Infrared Technology X,* 1984, 139–148.

M. Cantagrel, et al. "Argon Ion Etching in a Reactive Gas," *Journal of Materials science 8,* 1973, pp. 1711–1716.

D. J. Warner, et al., "The Preparation and Performance of Reticulated Targets for the Pyroelectric Vidicon," *Ferroelectrics,* 1981, vol. 33, pp. 249–253.

S. Wolf, et al., "Silicon Processing for the VLSI Era," vol. I, Process Technology (4 pages).

METHOD FOR ETCHING THROUGH A SUBSTRATE TO AN ATTACHED COATING

This application is related to copending U.S. application Ser. No. 08/464,981, filed Jun. 5, 1995 by James F. Belcher, et al., entitled *Method and Structure for Forming an Array of Thermal Sensors*; copending, U.S. application Ser. No. 08/368,068 filed Jan. 3, 1995 by James F. Belcher, etal., entitled *Structure and Method Including Dry Etching Techniques for Forming an Array of Thermal Sensitive Elements*; U.S. application Ser. No. 08/093,111 filed Jul. 16, 1993 and entitled *Etching of Transition Metal Oxides*, now abandoned; copending U.S. application Ser. No. 08/235,835 filed Apr. 29, 1994 and entitled *Inter-Pixel Thermal Isolation for Hybrid Thermal Detectors*, now U.S. Pat. No. 5,424,544; and copending U.S. application Ser. No. 08/235,068 filed Apr. 29, 1994, entitled *Thermal Isolation Structure for Hybrid Thermal Detectors*, now U.S. Pat. No. 5,426,304.

TECHNICAL FIELD OF THE INVENTION

The invention relates generally to semiconductor fabrication processes and more specifically to a method for etching through a substrate formed from a first material to an attached layer formed from a second material to provide a semiconductor type structure such as a focal plane array for a thermal detector.

BACKGROUND OF THE INVENTION

One common application for thermal sensors is in thermal (infrared) detection devices such as night vision equipment. One such class of thermal detection devices includes a focal plane array of infrared detector elements or thermal sensors coupled to an integrated circuit substrate with a corresponding number of contact pads disposed between the focal plane array and the integrated circuit substrate. The thermal sensors typically define the respective picture elements or pixels of the resulting thermal image.

One type of thermal sensor includes a thermal sensitive element formed from pyroelectric material that exhibits a state of electrical polarization and capacitance dependant upon temperature changes in response to thermal radiation. Barium strontium titanate (BST) is one example of such pyroelectric material. For some applications, an infrared absorber and common electrode assembly may be disposed on one side of the thermal sensitive elements. A sensor signal electrode may be disposed on the opposite side of each thermal sensitive element. The infrared absorber and common electrode assembly typically extends across the surface of the associated focal plane array and may be coupled to each of the thermal sensitive elements. Each thermal sensitive element may have its own separate signal sensor electrode. Each infrared detector element or thermal sensor is defined (in part) by the infrared absorber and common electrode assembly and a respective sensor signal electrode. The thermal sensitive elements may function as a dielectric disposed between the common electrode and the respective sensor signal electrodes which function as capacitive plates.

Various techniques associated with fabrication of very large scale integrated circuits have been used to fabricate a focal plane array and its associated integrated circuit substrate. Examples of such techniques include wet etching and dry etching. Such dry etching techniques typically include ion milling, plasma etching, reactive ion etching, and reactive ion beam etching. Also, laser etching or milling techniques have been used for some applications. Both isotropic and anisotropic etching techniques may be used depending upon the desired configuration for the resulting focal plane array and/or its associated integrated circuit substrate.

Problems associated with both wet and dry etching techniques include undesired etching of the mask layer and/or undesired etching of the substrate and/or other layers deposited during previous fabrication steps. Also, techniques for determining the desired end point of an etching process are critical to prevent over etching and to increase both throughput and reproduceability of the fabrication process. Previously available etching techniques have not provided the desired selectivity to effectively fabricate a focal plane array with the desired throughput and reproduceability between product runs. Ion milling and laser milling techniques are often unsatisfactory because it is difficult to find a relatively thin but effective etch stop to prevent both techniques from removing more material than desired. Also, laser milling frequently produces slag which further limits the use of this technique.

SUMMARY OF THE INVENTION

In accordance with the present invention, the disadvantages and problems associated with previous techniques such as plasma etching, ion milling, and laser milling used to fabricate thermal sensors from a substrate having multiple layers of different materials disposed thereon have been substantially reduced or eliminated. The present invention allows fabricating a thermal sensor from a substrate of selected pyroelectric and/or bolometric material using an ultraviolet electromagnetic radiation activated etching process. The resulting thermal sensors cooperate with each other to form a focal plane array which may be coupled with a thermal isolation structure disposed on an integrated circuit substrate as part of a thermal imaging system. One aspect of the present invention may include forming multiple thermal sensitive elements from a substrate of pyroelectric material having a common electrode attached to one side of each thermal sensitive element and an electrically conductive contact disposed on the opposite side of each thermal sensitive element.

Another aspect of the present invention may include a method for etching through unmasked regions of a substrate formed from a first material to an attached coating formed from a second material. Electrically conductive contacts may be provided to further shield selected masked regions of the substrate during irradiation of unmasked regions on the substrate. The unmasked regions may then be exposed to an etchant and irradiated to substantially increase reactivity with the etchant such that the etchant etches the unmasked regions substantially faster than it etches the contacts.

Technical advantages provided by one aspect of the present invention may include an anisotropic etching process that substantially reduces or eliminates undercutting of mask layers associated with respective masked regions of a substrate and substantially increases the etch rate as compared to other fabrication techniques.

Technical advantages provided by another aspect of the present invention includes an etching process that a process controller can effectively stop at a precise time.

Further technical advantages provided by yet another aspect of the present invention may include an etching process that selectively etches through only one side of a substrate to a common electrode coating disposed on the other side of the substrate. The present invention provides highly selective etching processes which differentiate between the various materials typically used to form a focal plane array associated with a thermal detector. For example, the teachings of the present invention allow selectively etching different materials such as masked and unmasked regions of a substrate of pyroelectric material and a common electrode coating disposed on the substrate opposite from the masked and unmasked regions to produce an array of thermal sensors, have a desired geometrical configuration and electrical signal characteristics.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1–5B of the drawings, like numerals being used for like and corresponding parts of the various drawings.

Figure 1:
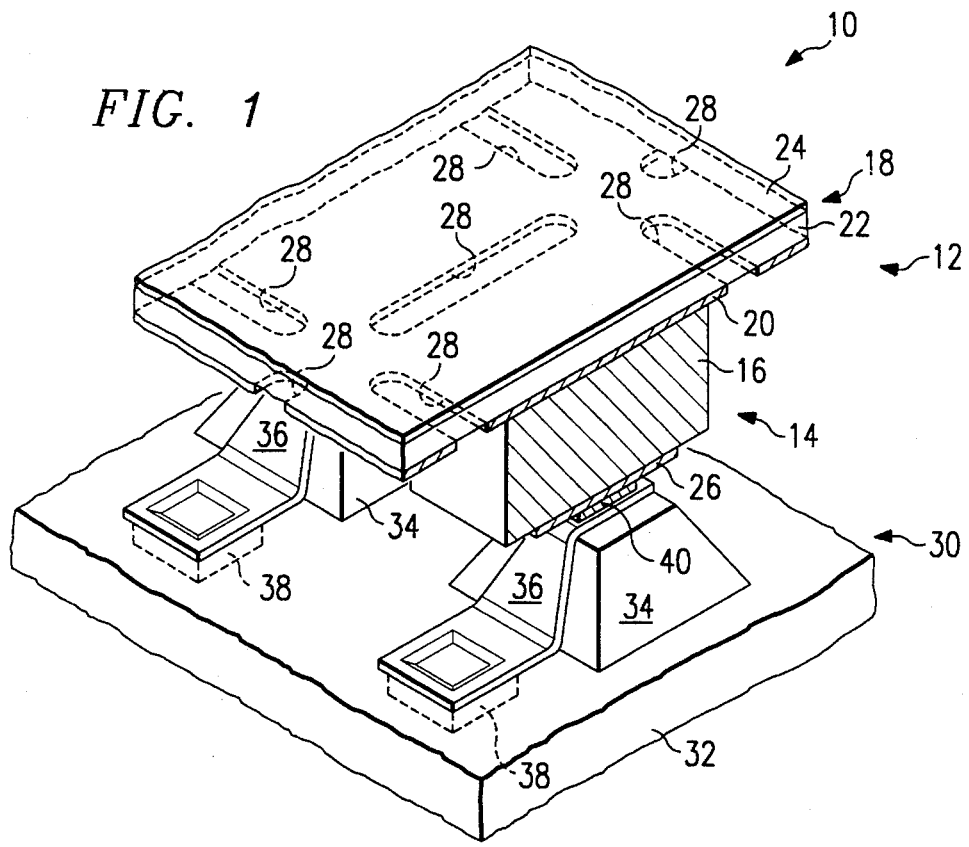
FIG. 1 is a perspective view showing a portion of a thermal imaging system that can be formed according to teachings of the present invention.

FIG. 1 shows a portion of thermal imaging system 10 having focal plane array 12 comprising an array of thermal sensors 14 that can be formed according to the teachings of the present invention. Sensors 14 each include a thermal sensitive element 16, which in one aspect of the present invention may be formed from a pyroelectric substrate comprising barium strontium titanate (BST). Thermal sensitive element 16 may be formed from various types of pyroelectric and/or bolometric material in accordance with the teachings of the present invention.

In one embodiment, infrared absorber and common electrode assembly 18 is preferably attached to one side of each thermal sensitive element 16. Infrared absorber and common electrode assembly 18 is typically a multiple layered structure that forms a resonant cavity tuned to maximize absorption of the selected infrared spectrum depending in part upon the type of material used to form thermal sensitive element 16. Infrared absorber and common electrode assembly 18 includes common electrode 20 which is preferably attached to one side of each thermal sensitive element 16.

One or more layers of thermal sensitive optical coating 22 may be disposed on common electrode 20 opposite from thermal sensitive elements 16. Optical coating 22 may be formed from an organic material such as parylene. The thickness of optical coating layer 22 may be adjusted as appropriate for its refractive index to maximize absorption over the desired infrared spectrum. A thin outer layer 24 of semitransparent metal, is disposed on optical coating layer 22 opposite from common electrode 20. Nichrome (NiCr) is one example of the material which may be used to form common electrode 20. Common electrode 20 is typically relatively thin as compared to optical coating 22.

Sensor signal electrodes 26 are preferably attached to the respective opposite side of each thermal sensitive element 16. Slots 28 may be formed, i.e., reticulated, into common electrode 20 to provide enhanced thermal isolation between adjacent thermal sensors 14. Alternatively, slots 28 may extend partially or fully through optical coating layer 22 and outer layer 24.

Thermal isolation structures 30 are typically provided to support thermal sensors 14 on integrated-circuit substrate 32. Each isolation structure 30 includes a mesa-type structure 34, a mesa strip conductor 36, and a contact pad 38. A layer 40 of metallic bump-bonding material may be used to electrically couple each mesa-strip conductor 36 to a respective sensor signal electrode 26.

In operation, thermal imaging system 10 forms a pixel image of a scene from absorbed infrared radiation. Each thermal sensor 14 provides at contact pad 38 an electrical signal whose value is proportional to the amount of infrared radiation absorbed by the respective thermal sensor 14. Thus, each thermal sensor 14 will generally provide data for one pixel of the resulting image.

Typically, a section of infrared absorber and common electrode assembly 18, corresponding to each thermal sensor 14, will absorb infrared radiation which changes the temperature of the respective thermal sensitive element 16. For pyroelectric materials this temperature change will vary the electrical polarization and/or capacitance of the respective thermal sensitive element 16. An electrical current or voltage may flow between common electrode 20 and contact pad 38 via the respective thermal sensitive element 16, electrode 26, layer 40, and strip conductor 36. Thus, the changes in the electrical characteristics of the thermal sensitive element 16 varies this current or voltage in proportion to the amount of infrared radiation absorbed by the respective thermal sensor 14.

Thermal imaging system 10 is further described in U.S. patent application Ser. No. 08/235,835, entitled *Inter-Pixel Thermal Isolation For Hybrid Thermal Detectors*, Attorney's Docket TI-18636, filed Apr. 29, 1994, now U.S. Pat. No. 5,727,544 and assigned to Texas Instruments Incorporated, Dallas, Tex. For some applications common electrode 20 may be replaced with a layer of nonconductive material (not shown) and a second electrode (not shown) similar to electrode 26 may be formed on each thermal sensitive element 16.

One aspect of the present invention includes a method for forming thermal sensitive elements 16 and related components of thermal sensors 14 by etching substrate 48 and multiple layers of material disposed thereon (FIGS. 2A–5B) from one side only. As previously noted, substrate 48 may be formed from various types of pyroelectric and/or bolometric material.

Substrate 48 preferably has dimensions associated with four, six, or eight inch disks or wafers compatible with fabrication techniques for very large scale integrated circuits. Infrared absorber and common electrode assembly 18 is preferably attached to one side of substrate 48. For purposes of illustration, only common electrode 20 is shown in FIGS. 2A through 5B. Various other layers which form infrared absorber and common electrode assembly 18 may also be disposed on the one side of substrate 48 depending upon the specific types of material and fabrication techniques which will be used to form thermal imaging system 10.

As shown in FIGS. 2A through 5B various types of mask structures 47 may be formed on the other side of substrate 48 opposite from common electrode 20. Mask structures 47 are used to provide masked regions 51 and unmasked regions 53 on substrate 48. As will be explained later in more detail, mask structures 47 may also be formed to protect electrically conductive contacts 49 during the associated etching process.

Figure 2A:
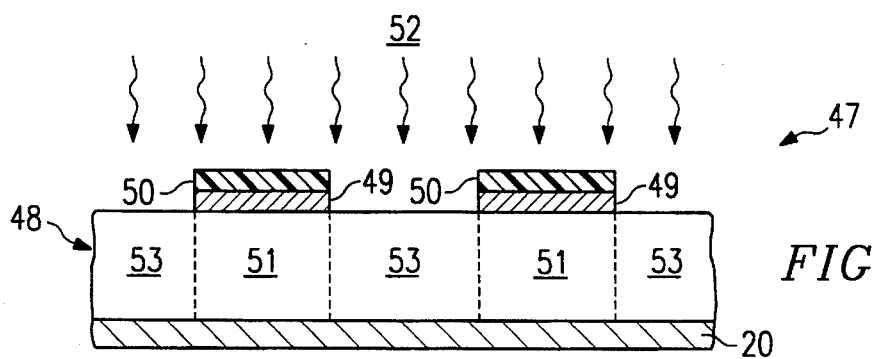
FIGS. 2A and 2B are drawings in section with portions broken away of a substrate having masked and unmasked regions, electrically conductive contacts, and a common electrode coating or layer formed according to one embodiment of the present invention.
Figure 2B:
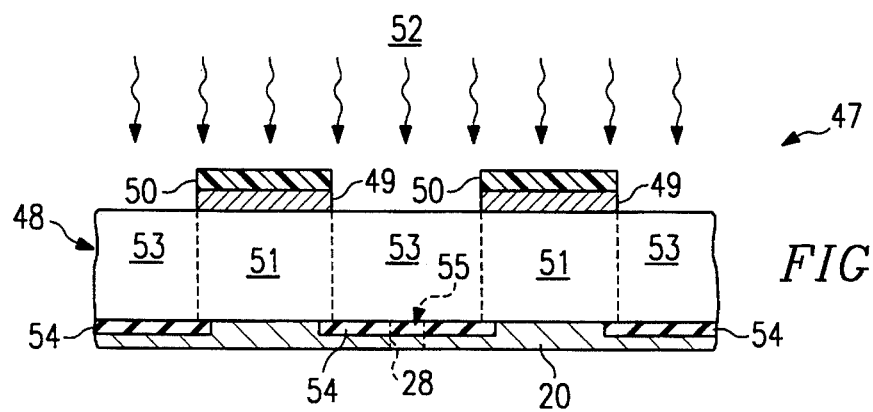

In accordance with the teachings of the present invention, an ultraviolet radiation (UVR) etching process may be used to form thermal sensitive elements 16 from substrate 48. A process controller (not shown) can precisely stop the UVR etching process, which is anisotropic and thus reduces undercutting of masked regions 51 on substrate 48. FIGS. 2A and 2B show one type of mask structure 47 for forming thermal sensitive elements 16 from substrate 48. For clarity, optical coating layer 22 has been omitted since it may be formed on common electrode 20 before or after thermal sensitive elements 16 are formed.

Referring to FIG. 2A, after common electrode 20 and substrate 48 have been formed, electrically conductive contacts 49 may be deposited or otherwise formed on substrate 48 opposite from common electrode 20 to correspond with masked regions 51 and unmasked regions 53. After the completion of the desired etching process, masked regions 51 become thermal sensitive elements 16 and electrically conductive contacts 49 typically become sensor signal electrodes 26. Electrically conductive contacts 49 may be formed from various types of material such as nickel, nichrome, platinum, titanium tungsten, tantalum, palladium, ruthenium, ruthenium oxide and other materials having the desired electrical conductivity. For some applications electrically conductive contacts 49 may be formed from various types of nonmetallic, electrically conductive types of material.

Mask layers 50 may be deposited or otherwise formed over the exposed portions of the respective contacts 49 opposite substrate 48. Various types of masking materials such as photoresist may be used to form mask layers 50 depending upon the specific etchant selected for the etching process. By combining mask layers 50 with electrically conductive contacts 49, materials such as silicone dioxide ($SiO_2$) which are generally transparent to ultraviolet radiation may be satisfactory to form layers 50. Thus, layers 50 and contacts 49 cooperate with each other to allow selecting the desired etchant for removal of unmasked regions 53 while at the same time providing adequate protection for masked regions 51.

During the etching process, substrate 48 including mask structure 47 is exposed to an etchant 52, which is typically a fluid. In substantially the same direction as shown by the arrows, unmasked regions 53 may be irradiated with electromagnetic radiation, which is typically ultraviolet light having a wavelength of less than 400 nanometers. For some applications etchant 52 may be a chloride solution constituting of ten percent (10%) HCl plus water such that during irradiation, unmasked regions 53 become substantially more reactive with etchant 52 than they are absent exposure to electromagnetic radiation. For other applications, etchant 52 may be a chloride salt solution such as $NH_4Cl$ or NaCl. For further applications various acid and salt solutions such as HF, HBr, HI, $NH_4F$, $N_4BR$, $NH_4I$, $CaF_2$, KBr, NaI and other simple salt or acid solutions may be satisfactorily used as etchant 52.

In contrast, the materials used to form electrically conductive contacts 49 and mask layers 50 are preferably selected so that there is little or no increase in their reactivity with etchant 52 during the irradiation period. Thus, etchant 52 will etch unmasked regions 53 much faster than it etches electrically conductive contacts 49 and mask layers 50. Furthermore, because unmasked regions 53 are irradiated from a direction substantially normal to the surface of substrate 48, etchant 52 will anisotropically etch unmasked regions 53 with reduced undercutting of electrically conductive contacts 49 and mask layers 50 as compared to previous etching processes.

Electrically conductive contacts 49 often serve several purposes. As discussed above, when the thermal sensors 14 are complete, contacts 49 may constitute all or part of electrodes 26 of FIG. 1. Also, during the etching process, contacts 49 are preferably formed from materials which block electromagnetic radiation and thus reduce or eliminate undercutting of the respective masked regions 51 by shielding them from the electromagnetic radiation. Contacts 49 may be formed from nickel, tantalum, titanium/tungsten, aluminum or other materials as previously mentioned having the desired electrical conductivity and are substantially non-reactive with the selected etchant 52 while blocking UV radiation.

Mask layers 50 may be formed from spun-on silicon dioxide, which absorbs little or no electromagnetic radiation, and, hence, remains nonreactive with etchant 52 during irradiation. However, as discussed below, radiation-absorbing materials may be used for mask layers 50 as long as etchant 52 etches such materials substantially slower than it etches unmasked regions 53 during the irradiation period.

Mask layer 50 may also be formed from various nonmetal elements and compounds which absorb electromagnetic radiation during etching of unmasked regions 53 but are not etched by etchant 52. Examples of such alternative materials for forming mask layer 50 include spun-on silicon oxide doped with transition metals such as iron (Fe), palladium (Pd) or manganese (Mn) which will absorb electromagnetic radiation and still not react with selected etchant 52. Poly-Si is an example of another material which absorbs electromagnetic radiation and only etches slowly when exposed to etchant 52. Other alternative materials include silicon nitride ($Si_3N_4$), aluminum oxide ($Al_2O_3$), boric oxide ($B_2O_3$) and tantalum oxide ($Ta_2O_5$). The above materials may be selectively deposited as desired using standard semiconductor fabrication techniques such as spun-on and fired, chemical vapor deposition, plasma enhanced chemical vapor deposition, sputter deposition, reactive sputter deposition as well as electron beam and thermal evaporation with or without reactive deposition.

Typically, during the etch process, common electrode 20, contacts 49, and mask layers 50 are substantially nonreactive with etchant 52. For some applications common electrode 20 may be formed from metals such as platinum or tantalum which are substantially nonreactive for the selected etchant 52. Even if etchant 52 etches these components, it typically does so much more slowly than it etches unmasked regions 53. Thus, common electrode 20 and contacts 49 are preferably etched only an insignificant amount when the etch process for substrate 48 is complete. One advantage provided by this nonreactivity is that even if the etching process is not precisely stopped, common electrode 20 is not excessively etched. Another advantage is that mask layers 50 may be omitted if slight etching of contacts 49 can be tolerated.

Once unmasked regions 53 have been etched through to common electrode 20, the process controller (not shown) can precisely and abruptly stop the etching process by discontinuing the electromagnetic irradiation. Mask layers 50 may then be removed, but as discussed above, electrically conductive contacts 49 preferably remain on the resulting thermal sensitive element 16 to constitute electrodes 26.

Referring to FIG. 2B, mask structure 47 and the etching process corresponding thereto are similar to those discussed in conjunction with FIG. 2A except for etch stops 54 formed between common electrode 20 and portions of substrate 48. Etch stops 54 prevent unwanted etching of common electrode 20, particularly if electrode 20 is formed from material that is reactive with the selected etchant 52.

After unmasked regions 53 have been satisfactorily removed by etchant 52, the exposed portion of etch stop 54 may be removed along with mask layers 50. Like mask layers 50, etch stop 54 may be formed from spun-on silicon dioxide or any other material that the selected etchant 52 removes substantially more slowly than unmasked regions 53 during periods of irradiation.

Etch stop 54 may include one or more openings 55, which are outlined with dashed lines to allow etching, i.e., reticulation, of common electrode 20 to form slots 28 (FIG. 1) as shown. To accomplish this reticulation, common electrode 20 may be formed from a material that is reactive with etchant 52 or, after the desired etching of substrate 48 is complete, another etchant (not shown) may be used to reticulate common electrode 20. As discussed above, such reticulation reduces thermal transfer between adjacent thermal sensors 14, but maintains the desired electrical flow path through common electrode 20 to each thermal sensitive element 16.

Figure 3A:
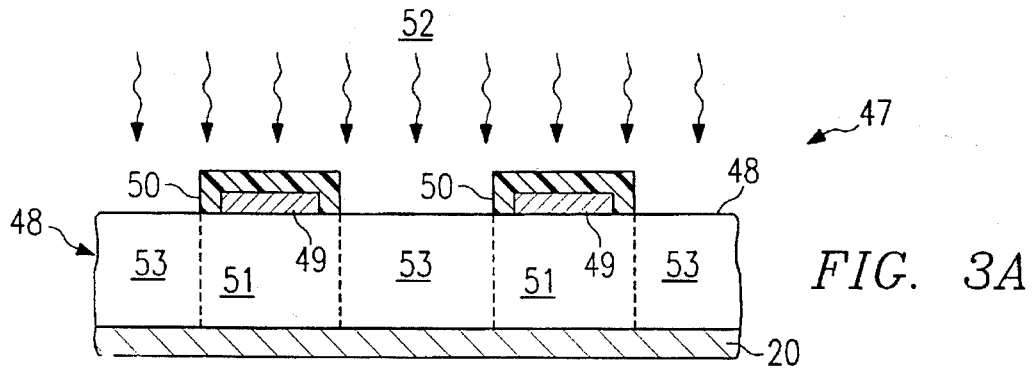
FIGS. 3A and 3B are respective alternate embodiments of the substrate, masked and unmasked regions, electrically conductive contacts, and common electrode coating of FIGS. 2A and 2B.

FIG. 3A shows an alternate embodiment of the mask structure 47 of FIG. 2A. In this embodiment, mask layers 50 encapsulates substantially all of the exposed portions of the respective contacts 49 to prevent etchant 52 from etching these exposed portions. That is, mask layers 50 forms a fluid barrier between etchant 52 and the exposed portions of contacts 49. Thus, this encapsulation allows contacts 49 to be formed from a material that may be reactive with the selected etchant 52. For other applications contacts 49 may be formed from materials selected to either block or not block UV radiation depending upon the type of etchant 52. The material used to form contact 49 may thus be varied to provide greater options for selecting etchant 52.

Figure 3B:
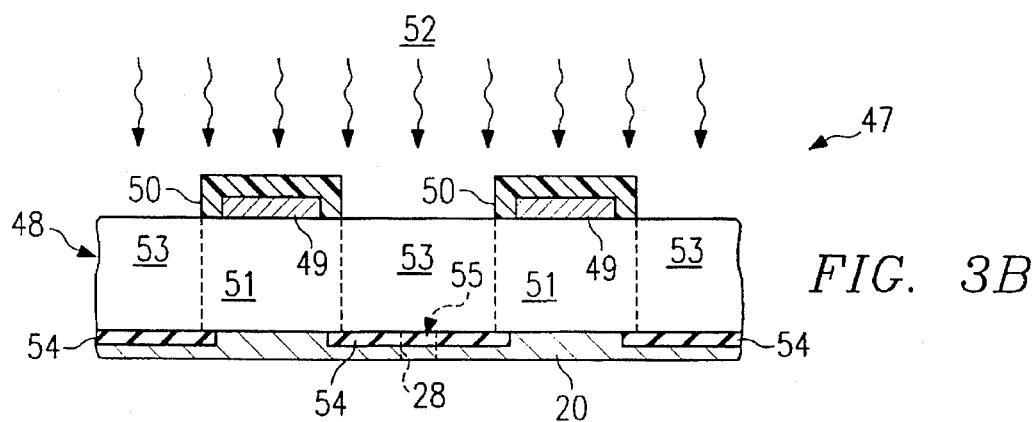

FIG. 3B shows an embodiment similar to FIG. 3A with the addition of etch stops 54 for the purposes described above in conjunction with embodiment of FIG. 2B.

Figure 4A:
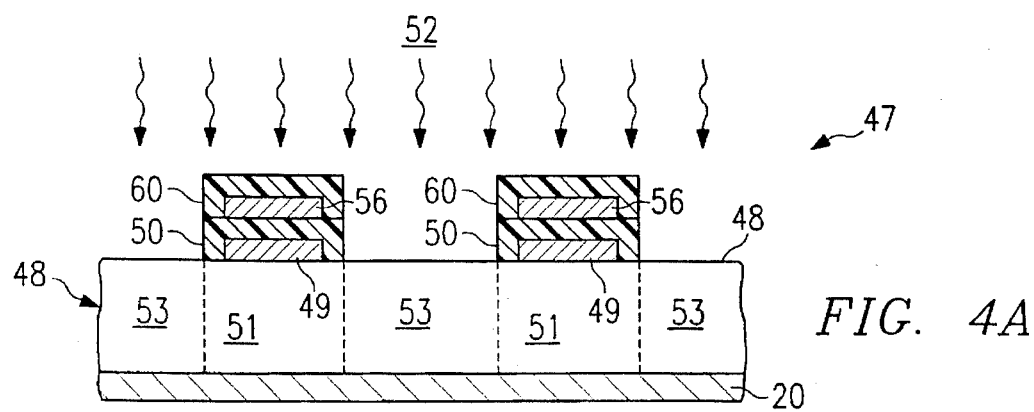
FIGS. 4A and 4B are additional respective alternate embodiments of the substrate, masked and unmasked regions, electrically conductive contacts, and common electrode coating of FIGS. 2A and 2B.

FIG. 4A shows another alternate embodiment of the mask structure 47 of FIG. 2A. As described above in conjunction with FIG. 3A, mask layers 50 encapsulate contacts 49 to prevent undesired etching thereof. A second layer of metal or nonmetal contacts 56 may be deposited or otherwise formed on mask layers 50. Then, second mask layers 60 may be deposited or otherwise formed to encapsulate respective contacts 56. The etching process may then proceed as described above in conjunction with the embodiment of FIG. 2A.

By increasing the rigidity of mask structure 47, contacts 56 and mask layers 60 cooperate to substantially reduce or eliminate the instances and severity of any possible peel up of contacts 49. Peel up may occur when a selected etchant 52 undercuts the edges of contacts 49. Such undercutting may cause the respective contact 49 to curl and thus peel away from substrate 48. Like mask layers 50, mask layers 60 may be formed from any material that etchant 52 etches substantially slower than substrate 48 during the irradiation period. For example, mask layers 60 may be formed from spun-on silicon dioxide.

After substrate 48 is etched through to common electrode 20, mask layers 50 and 60 and contacts 56 may be removed. Contacts 49 will preferably remain and constitute electrodes 26 as described above.

Figure 4B:
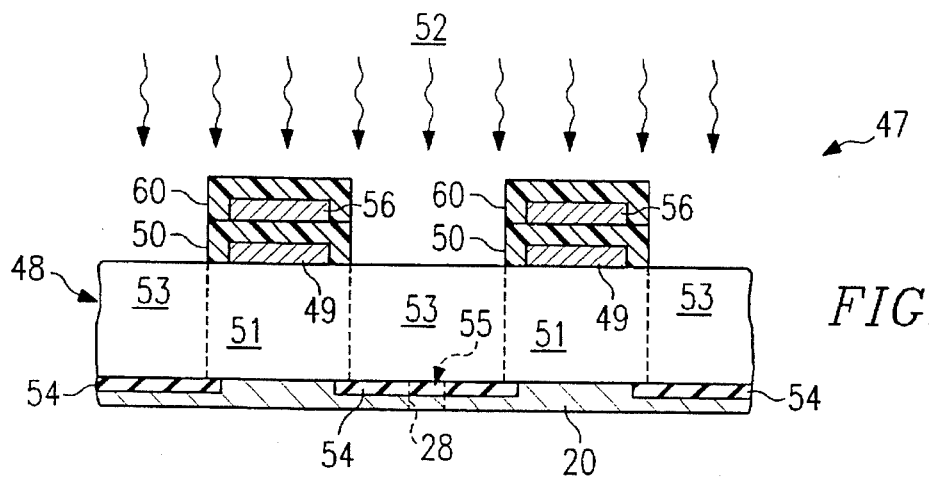

FIG. 4B is an embodiment of mask structure 47 similar to that of FIG. 4A with the addition of etch stops 54, which are described above in conjunction with the embodiment of FIG. 2B.

Figure 5A:
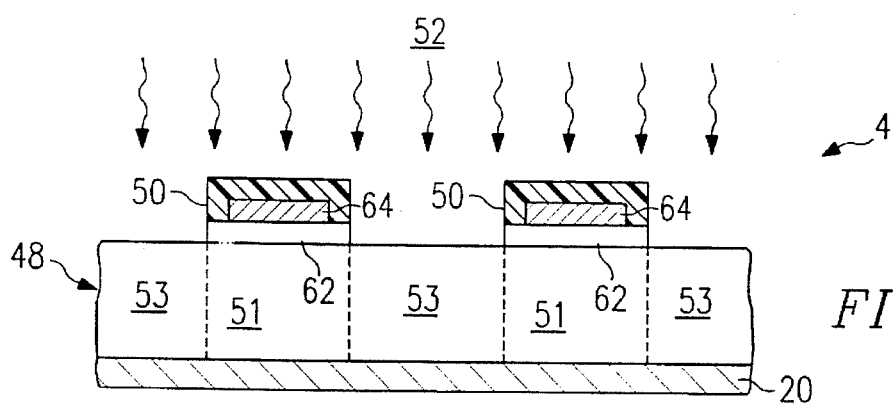
FIGS. 5A and 5B are respective alternate embodiments of the substrate, masked and unmasked regions, electrically conductive contacts, and common electrode coating of FIGS. 4A and 4B.

FIG. 5A shows an alternate embodiment of the mask structure 47 of FIG. 4A. First, intermediate mask layers 62 are deposited or otherwise formed over the desired regions 51, which as described above will become the respective thermal sensitive elements 16 of thermal sensors 14. Next, contacts 64 formed from material that will either absorb or reflect electromagnetic radiation are deposited or otherwise placed over mask layers 62. Then, mask layers 50 are deposited or otherwise formed to encapsulate contacts 64. Intermediate mask layers 62 may comprise spun-on silicon oxide doped with transition metals or may comprise material selected from the group consisting of $SiO_2$, $Si_3N_4$, $Al_2O_3$, $B_2O_3$ and $Ta_2O_5$.

Contacts 64 shield the resulting masked regions 51 during irradiation thereof. However, because mask layers 62 separates contacts 64 from substrate 48, contacts 64 may be relatively easily removed along with mask layers 50 and 62 after completion of the etching process. Then, electrodes 26 may be formed on thermal sensitive elements 16. Thus, because electrodes 26 are formed upon completion of the etching process for substrate 48, they are not subjected to possible peel up or etching during the etching process for substrate 48.

Figure 5B:
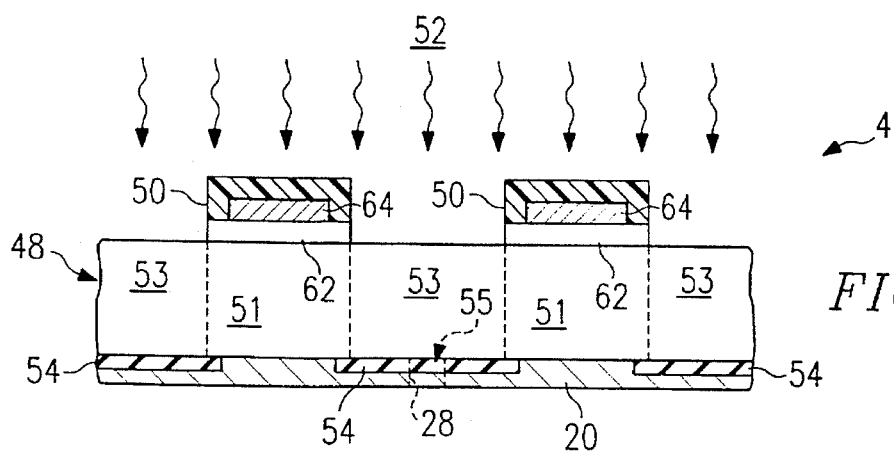

Mask structure 47 of FIG. 5B is similar to that of FIG. 5A with the addition of etch stops 54, which are described above in conjunction with the embodiment shown in FIG. 2B.

Although the present invention and its advantages have been described in detail, it should be understood that various changes, substitutions and alterations can be made therein without departing from the spirit and scope of the invention as defined by the appended claims.

What is claimed is:

1. A method for etching through unmasked regions on one side of a substrate having both masked and unmasked regions to a coating disposed on the opposite side of said substrate comprising the steps of:

forming a number of contacts on said one side of said substrate to shield said masked regions of said substrate during irradiation of said unmasked regions;

forming a mask layer over a portion of each of said contacts to define in part said masked region;

exposing said substrate to an etchant; and irradiating said substrate while exposed to said etchant with ultraviolet electromagnetic radiation to substantially increase reactivity between said unmasked regions and said etchant such that said etchant removes said unmasked regions substantially faster than said masked regions shielded by said contacts.

2. The method of claim 1 wherein said ultraviolet electromagnetic radiation has a wavelength less than 400 nanometers.

3. The method of claim 1 wherein said step of irradiating comprises irradiating said unmasked regions with ultraviolet radiation substantially normal to said one side of said substrate.

4. The method of claim 1 wherein said etchant is selected from the group consisting of an aqueous solution of $NH_4Cl$, NaCl, HF, HBr, HI, $NH_4F$, $NH_4Br$, $NH_4I$, $CaF_2$, KBr and NaI.

5. The method of claim 1 further comprising the steps of:
forming an etch stop disposed between said substrate and said coating in general alignment with each of said unmasked regions; and
etching said unmasked region until said respective etch stops are exposed to said etchant.

6. The method of claim 1 wherein said coating comprises an electrode common to said masked regions.

7. The method of claim 1 wherein said etchant comprises ten percent HCl in a water solution.

8. The method of claim 1 wherein said contacts comprise material selected from the group consisting of nickel, nichrome, platinum, titanium tungsten, tantalum, palladium, ruthenium and ruthenium oxide.

9. A method for etching through unmasked regions of a substrate to an attached coating in the fabrication of a thermal sensor, said substrate having both masked and unmasked regions, comprising the steps of:
forming a number of first mask layers to define in part said masked regions and said unmasked regions on one side of said substrate opposite from said coating;
forming a first set of contacts to shield said masked regions of said substrate during irradiation of said unmasked regions;
encapsulating exposed portions of each of said first set of contacts with said respective first mask layers to provide a fluid barrier between said first set of contacts and a selected etchant;
exposing said substrate to said selected etchant;
irradiating said substrate while exposed to said selected etchant with electromagnetic radiation to substantially increase the reactivity between said unmasked regions and said etchant such that said etchant etches said unmasked regions substantially faster than said first mask layers and said masked regions.

10. The method of claim 9 wherein said substrate comprises barium strontium titanate.

11. The method of claim 9 wherein during said step of irradiating, said etchant etches said unmasked regions substantially faster than said coating.

12. The method of claim 9 further comprising the steps of:
forming a second set of contacts respectively on said first mask layers; and
encapsulating exposed portions of each of said second set of contacts with a second mask layer.

13. The method of claim 9 further comprising the steps of:
forming a number of etch stops disposed between said substrate and said coating with each etch stop in general alignment with one of said unmasked regions;
forming an opening in each of said etch stops to expose portions of said coating; and
etching said exposed portions of said coating through said openings to form slots in said coating.

14. The method of claim 9 wherein said etchant comprises a chloride solution.

15. The method of claim 9 wherein said step of irradiating comprises irradiating said unmasked regions with ultraviolet radiation.

16. The method of claim 9 further comprising the step of forming an intermediate mask layer between each of said first contacts and said respective masked regions of said substrate.

17. The method of claim 9 further comprising the step of forming said first mask layers from spun-on silicon dioxide.

18. A method for etching through unmasked regions on one side of a substrate having both masked and unmasked regions to a coating disposed on an opposite side of said substrate comprising the steps of:
forming at least two contacts on said one side of said substrate to define in part respective masked regions of said substrate;
forming a mask layer over a portion of each of said contacts on said substrate to further define said respective masked regions of said substrate;
forming said contacts from a material selected to shield said respective masked regions of substrate during irradiation of said unmasked regions;
exposing said substrate to an etchant selected to have increased reactivity with said unmasked regions during irradiation of said unmasked regions; and
irradiating said substrate while exposed to said etchant with electromagnetic radiation to substantially increase reactivity between said unmasked regions and said etchant such that said etchant removes said unmasked regions substantially faster than said mask layers and said masked regions shielded by said contacts.

19. The method of claim 18 wherein said step of irradiating comprises irradiating said unmasked regions with ultraviolet radiation substantially normal to said one side of said substrate.

20. The method of claim 18 further comprising the steps of:
forming a number of etch stops disposed between said substrate and said coating with each etch stop generally aligned with one of said unmasked regions; and
etching said unmasked regions until said respective etch stops are exposed to said etchant.

21. The method of claim 18 wherein said coating comprises an electrode common to said masked regions.

22. The method of claim 18 wherein said etchant comprises ten percent HCl in a water solution.

23. The method of claim 18 wherein said contacts comprise material selected from the group consisting of nickel, nichrome, platinum, titanium tungsten, tantalum, palladium, ruthenium and ruthenium oxide.

24. The method of claim 18 wherein said electromagnetic radiation has a wavelength less than 400 nanometers.

25. The method of claim 18 wherein said etchant is selected from the group consisting of an aqueous solution of $NH_4Cl$, NaCl, HF, HBr, HI, $NH_4F$, $NH_4Br$, $NH_4I$, $CaF_2$, KBr and NaI.

26. A method for etching from one side of a substrate formed from thermal sensitive material through unmasked regions of said substrate to a common electrode attached to the other side of said substrate in the fabrication of a thermal sensor, said substrate having both masked and unmasked regions, comprising the steps of:
forming a first set of contacts on said substrate opposite from said common electrode with each of said first set of contacts aligned generally with one of said masked regions to shield said masked regions of said substrate during irradiation of said unmasked regions with ultraviolet radiation;

encapsulating exposed portions of said first set of contacts with respective first mask layers to provide a fluid barrier between said first set of contacts and a selected etchant and to further define said masked regions of said substrate;

forming a second set of contacts respectively on said first mask layers;

encapsulating exposed portions of said second set of contacts with a second mask layer; and exposing said substrate to said etchant and at the same time irradiating said unmasked regions with ultraviolet radiation to substantially increase the reactivity between said unmasked regions and said etchant such that said etchant etches said unmasked regions substantially faster than said first mask layers, said second mask layers, and said masked regions.

27. The method of claim 26 further comprising the steps of:

forming an etch stop disposed between each of said unmasked regions of said substrate and said common electrode;

forming an opening in each of said etch stops to expose portions of said common electrode;

etching said unmasked region to expose said respective etch stops; and etching said portions of said common electrode exposed through said openings in said etch stops to form slots in said common electrode.

28. The method of claim 26 wherein said etchant comprises a chloride solution.

29. The method of claim 26 further comprising the step of forming said first and said second mask layers from spun-on silicon dioxide.

30. The method of claim 26 wherein said substrate comprises barium strontium titanate.

* * * * *